United States Patent
Shin

(10) Patent No.: US 7,983,076 B2
(45) Date of Patent: Jul. 19, 2011

(54) NON-VOLATILE SEMICONDUCTOR MEMORY CIRCUIT FOR GENERATING WRITE VOLTAGE

(75) Inventor: Yoon Jae Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 91 days.

(21) Appl. No.: 12/494,362

(22) Filed: Jun. 30, 2009

(65) Prior Publication Data

US 2010/0265761 A1  Oct. 21, 2010

(30) Foreign Application Priority Data

Apr. 15, 2009  (KR) .................. 10-2009-0032671

(51) Int. Cl.
*G11C 11/00* (2006.01)
(52) U.S. Cl. .................. 365/163; 365/148; 365/189.16
(58) Field of Classification Search .................. None
See application file for complete search history.

(56) References Cited

U.S. PATENT DOCUMENTS

| 5,602,789 | A   | * | 2/1997  | Endoh et al. ............. 365/185.03 |
| 6,473,338 | B2  | * | 10/2002 | Sugimura ................ 365/185.03 |
| 7,012,834 | B2  |   | 3/2006  | Cho et al. |
| 7,085,154 | B2  | * | 8/2006  | Cho et al. ...................... 365/163 |
| 7,149,103 | B2  |   | 12/2006 | Ahn |
| 7,304,886 | B2  |   | 12/2007 | Cho et al. |
| 7,447,092 | B2  |   | 11/2008 | Cho et al. |
| 7,471,553 | B2  | * | 12/2008 | Lee et al. ...................... 365/163 |
| 7,483,303 | B2  | * | 1/2009  | Lee ........................... 365/185.18 |
| 7,502,251 | B2  |   | 3/2009  | Choi et al. |
| 7,532,533 | B2  | * | 5/2009  | Andre et al. ............... 365/225.7 |
| 2008/0062753 | A1 |   | 3/2008  | Cho et al. |
| 2009/0059658 | A1 |   | 3/2009  | Cho et al. |

FOREIGN PATENT DOCUMENTS

| JP | 2005-222687 A | 8/2005 |
| JP | 2007-087568 A | 4/2007 |
| JP | 2007-164971 A | 6/2007 |

* cited by examiner

*Primary Examiner* — Tan T. Nguyen
(74) *Attorney, Agent, or Firm* — Ladas & Parry LLP

(57) ABSTRACT

A non-volatile semiconductor memory circuit for generating a write voltage is presented. The non-volatile semiconductor memory circuit includes a memory cell and a voltage generator. The voltage generator provides a write voltage at a given target level that varies in accordance with an amount of current detected by the memory cell array by using a reference voltage.

25 Claims, 5 Drawing Sheets

NON-VOLATILE SEMICONDUCTOR MEMORY CIRCUIT FOR GENERATING WRITE VOLTAGE

CROSS-REFERENCES TO RELATED APPLICATION

The present application claims priority under 35 U.S.C. 119(a) to Korean application number 10-2009-0032671, filed on Apr. 15, 2009, in the Korean Intellectual Property Office, which is incorporated by reference in its entirety as if set forth in full.

BACKGROUND OF THE INVENTION

1. Technical Field

The present invention described herein relates to a non-volatile semiconductor memory circuit and, more particularly, to a non-volatile semiconductor memory circuit for generating a write voltage.

2. Related Art

Generally, a phase change random access memory (PRAM) tends to be researched and developed to be adopted to various semiconductor systems and semiconductor memory devices due to a characteristic in that it is common that the PRAM can randomly access data although the PRAM is a non-volatile memory.

A unit cell of the PRAM often times includes a diode, for example, one switching element connected to a word line and one variable resistor GST coupled to a bit line. The PRAM controls the reversible phase change of the variable resistor GST of the PRAM using electric pulse to store data in a memory cell. For example, a pulse signal of high voltage is applied for a predetermined time why the state of the variable resistor GST be changed during a write (or program) operation in the PRAM. At this time, in order to apply a high write voltage, voltage pump circuits are provided.

The PRAM commonly includes a plurality of voltage pump circuits to control the number of pumps driven in accordance with a data input and output mode to vary. Therefore, the PRAM requires a circuit for selecting the data input and output mode. In addition, a voltage in a no less than uniform level lower than the high voltage required for actually performing a write operation in a standby state where write and read operations are not performed is maintained so that the high voltage can be rapidly provided in a write mode. Therefore, a voltage pump circuit for the standby state is also required.

Therefore, since the PRAM needs the circuit for selecting the data input and output mode and separate controllers in the standby state and an active state (where the pumps are required to be driven), a large footprint is needed and the structure of the circuits is complicated.

SUMMARY

A non-volatile semiconductor memory circuit for generating a write voltage is described herein.

According to one embodiment, a non-volatile semiconductor memory circuit includes a memory cell array and a voltage generator configured to provide a write voltage in a target level that varies in accordance with an amount of current detected by the memory cell array using a reference voltage.

According to another aspect, a non-volatile semiconductor memory circuit includes a memory cell array, a write controller configured to repeatedly verify and determine whether input data is written down in the memory cell array to write the input data in response to a write command, and a voltage generator configured to control a voltage division ratio to vary in accordance with whether the memory cell array is in an active state to provide a write voltage in different target levels using a reference voltage.

According to still another embodiment, a non-volatile semiconductor memory circuit includes a memory cell array and a voltage generator configured to distinguish a standby state of the memory cell array from an active state of the memory cell array and then provide a write voltage in a corresponding target level in accordance with the state, by varying a target level in accordance with an amount of current detected by the memory cell array. The voltage generator generates the write voltage in a first target level in the standby state and generates the write voltage in a second target level larger than the first target level in the active state.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

A non-volatile semiconductor memory circuit according to one embodiment is configured to be able to sense the current of a cell to control the number of pump units and a target level. That is, the non-volatile semiconductor memory circuit distinguishes a standby state from an active state by the amount of the detected current and controls the target level to vary so that control can be easily performed without an additional circuit. In addition, since it is not necessary to include an additional circuit, it is possible to improve area efficiency.

Figure 1:
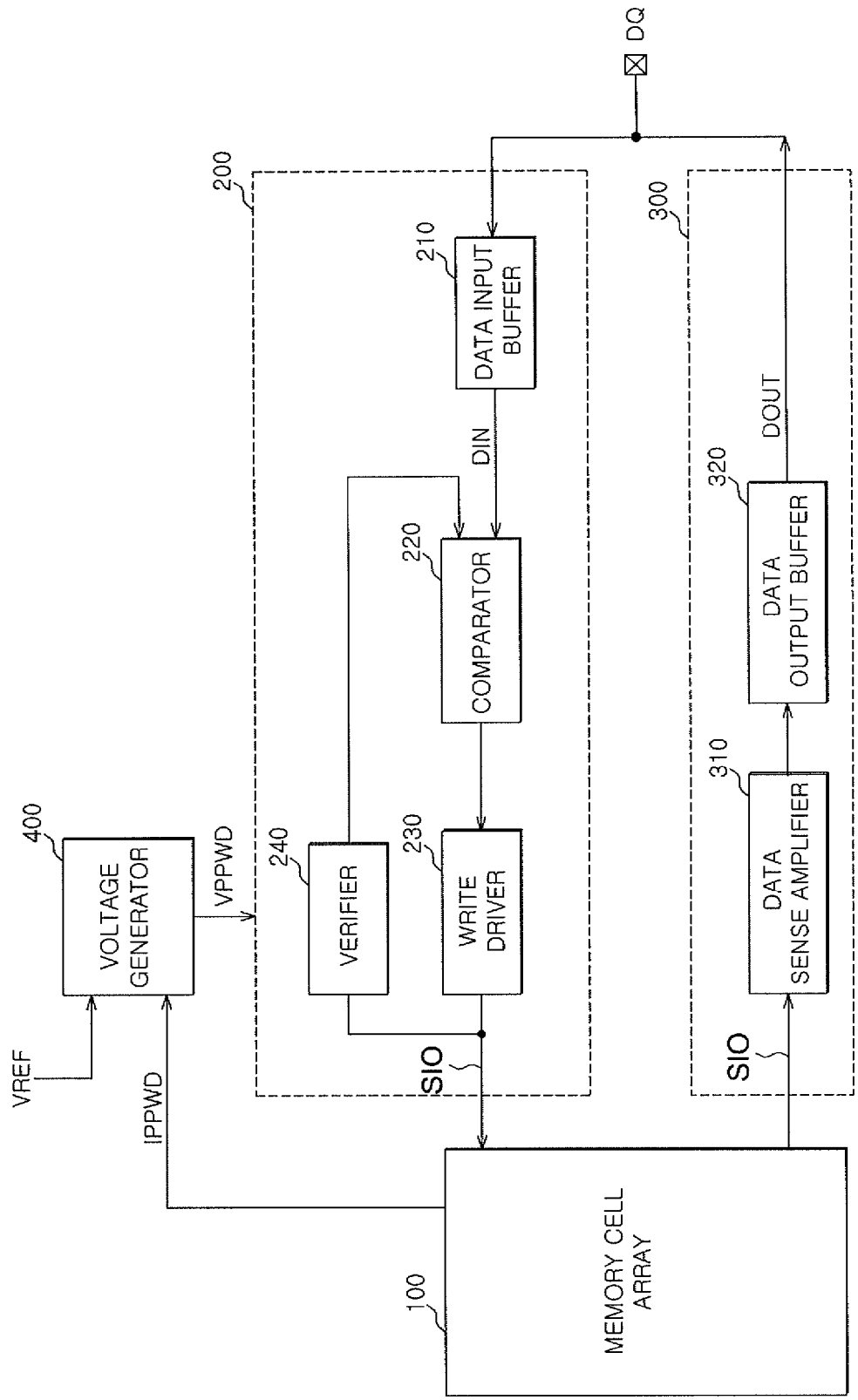
FIG. 1 is a block diagram of a structure of an example of a non-volatile semiconductor memory circuit according to one embodiment.

FIG. 1 is a block diagram of a structure of an example of a non-volatile semiconductor memory circuit according to one embodiment.

Referring to FIG. 1, the non-volatile semiconductor memory circuit includes a memory cell array 100, a write controller 200, a read controller 300, and a voltage generator 400.

The memory cell array 100 includes a plurality of phase change random access memory (PRAM) cells. In addition, each of the PRAM cells comprise a switching element coupled to a word line (not shown) and one variable resistor GST coupled to a bit line (not shown).

On the other hand, in the case of a write operation that changes the PRAM cell to be in a reset or set state, write current is to be applied for a considerably long time (for example, 100 ns). When the write current is simultaneously applied to cells of various bits, the amount of the current is considerably larger. Therefore, recently, in order to reduce the consumption of the current during a write operation, a new write operation is tried. For example, when the write operation is performed, a predetermined amount of write current (in accordance with write voltage pulse) is provided to a memory cell and the amount of the write current is reduced or increased in accordance with the result of verifying whether data is written. That is, when the write operation is performed, a process of reading the data of a corresponding cell to verify whether the read data is the same as data to be written and then, providing the write current is repeatedly performed. The read operation for performing the write operation is referred to as a 'verifying read operation'. A non-volatile semiconductor memory circuit for performing the 'verifying read operation' in the write mode will be described.

The write controller 200 receives the data to be written, that is, input data 'DIN', varies the amount of the write current, and provides the input data 'DIN' to the memory cell array 100 to write data.

First, a data input buffer 210 buffers the data provided by an external pad DQ to provide the input data 'DIN'.

A comparator 220 compares the input data 'DIN' with the output signal of a verifier 240 to control a write driver 230. To be specific, the comparator 220 compares the input data 'DIN' to be written down in the memory cell array 100 with the data output from the verifier 240 to determine whether the write driver 230 is needed to be driven. That is, the comparator 220 deactivates the write driver 230 when the output level of the input data 'DIN' coincides with the output level of the data output from the verifier 240 and the comparator 220 activates the write driver 230 when the output level of the input data 'DIN' does not coincide with the output level of the data output from the verifier 240.

The write driver 230 loads the input data 'DIN' to an input and output line SIO to write down the input data 'DIN' in the memory cell array 100.

The verifier 240 provides the result of sensing the level of the voltage that changes in accordance with the through current provided to the corresponding memory cell when the write current is applied to the corresponding memory cell to the comparator 220.

The read controller 300 as a common read circuit includes a data sense amplifier 310 and a data output buffer 320.

The data sense amplifier 310 senses the signal read from the memory cell array 100 and loaded to the input and output line SIO in accordance with a read command to provide output data 'DOUT'.

The data output buffer 320 buffers the output data 'DOUT' to provide the buffered output data 'DOUT' to the external input and output pad DQ. For convenience sake, the input and output lines SIO of the write controller 200 and the read controller 300 are illustrated as separate lines. However, one common input and output line may be used.

On the other hand, the voltage generator 400 senses the consumption amount of write current 'IPPWD' from the memory cell array 100 and distinguishes the standby state of the cell from the write state of the cell accordingly to provide a proper high write voltage 'VPPWD' to the write controller 200. Here, the standby state is defined as a state in which the cell is not actually accessed, that is, the read and write operations are waiting in readiness. Therefore, when the voltage generator 400 applies the write voltage 'VPPWD' to the write controller 200 such that the write voltage 'VPPWD' is sequentially increased or reduced from a predetermined voltage.

In particular, since the voltage generator 400 according to one embodiment can sense the actual write current 'IPPWD' of the memory cell array 100 in accordance with the driving of the cell to provide the write voltage 'VPPWD', an additional data input and output mode select circuit is not required. To be specific, the voltage generator 400 provides the write voltage 'VPPWD' in a predetermined first target level in the standby state. In addition, in the write mode, as the voltage generator 400 senses the write current 'IPPWD' that flows through the current cell and adds the number of driven pump units (not shown) so that the voltage generator 400 can provide the write voltage 'VPPWD' in a second target level higher than the first target level.

Figure 2:
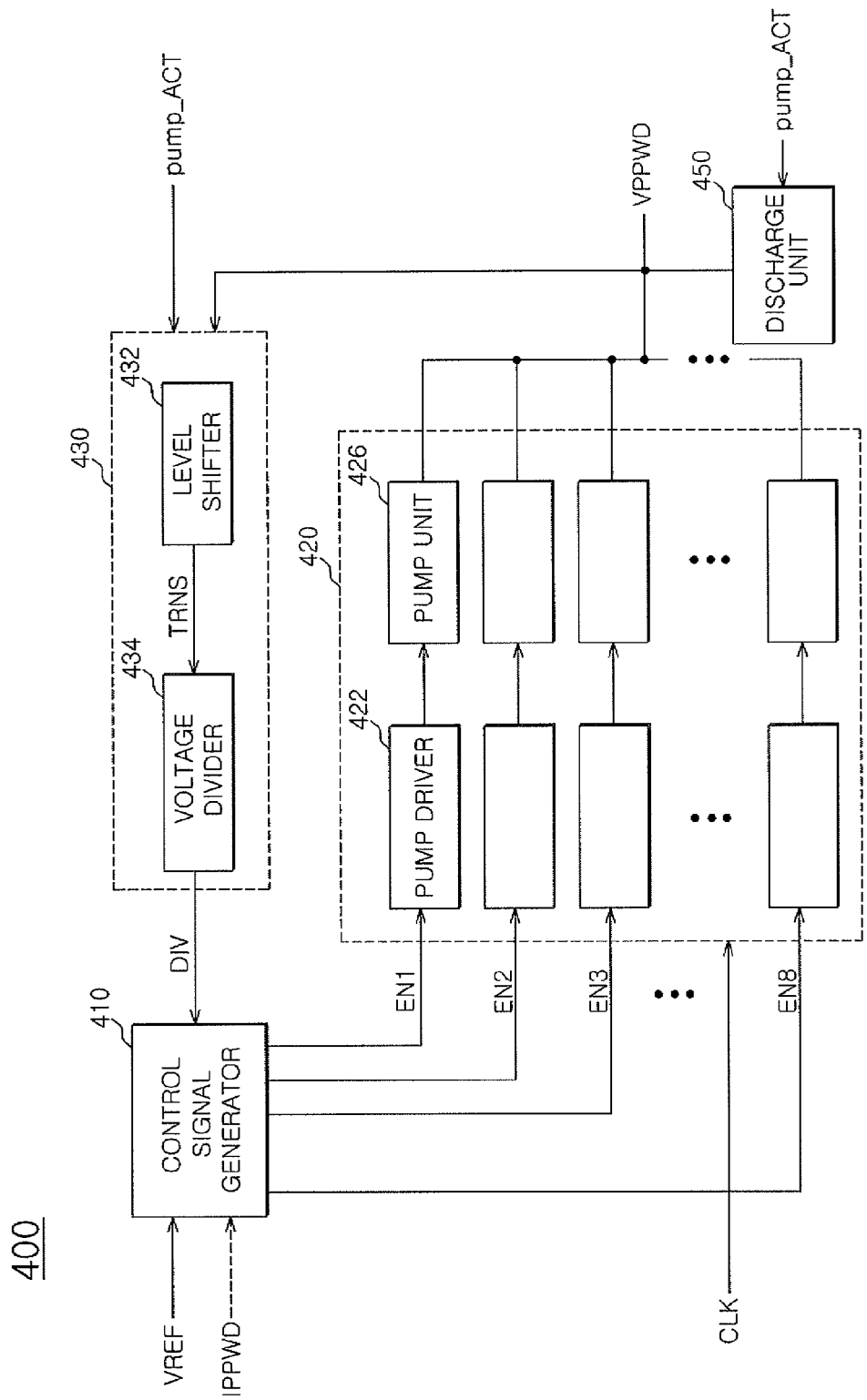
FIG. 2 is a block diagram showing a structure of an example of a voltage generator illustrated in FIG. 1.

Detailed description thereof will be performed with reference to FIG. 2.

FIG. 2 is a block diagram showing the voltage generator 400 illustrated in FIG. 1.

Referring to FIG. 2, the voltage generator 400 includes a control signal generator 410, a pump 420, a control voltage generator 430, and a discharge unit 450.

The control signal generator 410 provides a plurality of control signals 'EN1', 'EN2', 'EN3', . . . in response to a reference voltage 'VREF' and the control voltage level 'DIV' of the control voltage generator 430.

The control signal generator 410 according to one embodiment determines whether the control voltage level 'DIV' received using the reference voltage 'VREF' is included in a predetermined detection voltage section to provide the plurality of the control signals 'EN1', 'EN2', 'EN3', . . . 'EN8' that can control the number of driven pump units. Therefore, the control signal generator 410 selectively activates the plurality of the control signals 'EN1', 'EN2', 'EN3', . . . 'EN8' in response to the control voltage level 'DIV' to generate the control signals 'EN1', 'EN2', 'EN3', . . . 'EN8' having the write voltage 'VPPWD' in the first target level in the standby state and having the write voltage 'VPPWD' in the second target level in the write mode. In the control signal generator 410, since the voltage varies in accordance with the amount of the write current 'IPPWD' detected by the current memory cell array (refer to 100 of FIG. 1), the control signals 'EN1', 'EN2', 'EN3', . . . activated in accordance with the reference voltage 'VREF' can vary. Therefore, the control signal generator 410 can detect the amount of the write current 'IPPWD' to generate the control signals 'EN1', 'EN2', 'EN3', . . .

The control signal generator 410 according to one embodiment generates a plurality of voltage detect signals (not shown) using the reference voltage 'VREF' to generate the plurality of the control signals 'EN1', 'EN2', 'EN3', . . . in accordance with the amount of the current. Here, the second target level of the write voltage 'VPPWD' is higher than the first target level, which will be described later.

The pump 420 provides the write voltage 'VPPWD' in response to a clock signal 'CLK' and the plurality of the control signals 'EN1', 'EN2', 'EN3', . . . .

The pump 420 includes a plurality of pump drivers 422 and a plurality of pump units 426.

The plurality of the pump drivers 422 receive the control signals 'EN1', 'EN2', 'EN3', . . . , respectively, to be driven in response to the activated control signals 'EN1', 'EN2', 'EN3', . . . .

The plurality of the pump units 426 are provided to correspond to the pump drivers 422, respectively. The plurality of the pump units 426 are controlled by the activated pump drivers 422 and oscillated in accordance with the section of the clock signal 'CLK' to pump the voltage and to provide the write voltage 'VPPWD'. Since the pump 420 is a common pump circuit is well known to those skilled in the art, description thereof will be omitted.

The control voltage generator 430 according to one embodiment generates the control voltage level 'DIV' in response to the voltage of the output node of the pump 420, that is, the write voltage 'VPPWD' and a pump active signal 'pump_ACT'.

The control voltage generator 430 includes a level shifter 432 and a voltage divider 434. The control voltage generator 430 generates the control voltage level 'DIV' for the first target level of the write voltage 'VPPWD' in response to the deactivated pump active signal 'pump_ACT' and generates the control voltage level 'DIV' for the second target level of the write voltage 'VPPWD' in response to the activated pump active signal 'pump_ACT'. Therefore, the control voltage generator 430 distinguishes the active state from the standby state in accordance with whether the pump active signal 'pump_ACT' is activated and controls a voltage division ratio to vary accordingly to generate the control voltage level 'DIV' that intends the different target levels of the write voltage 'VPPWD'.

The voltage divider 434 divides the write voltage 'VPPWD' in a first division ratio in response to the deactivated pump active signal 'pump_ACT' and divides the write voltage 'VPPWD' in a second division ratio in response to the activated pump active signal 'pump_ACT', which will be described in detail later.

On the other hand, since the voltage divider 434 is the circuit of a high voltage 'VPP' level domain, it is necessary to change the level. Therefore, the level shifter 432 increases the activated level of the pump active signal 'pump_ACT' to a predetermined level. To be specific, the level shifter 432 shifts the pump active signal 'pump_ACT' of a normal operation voltage (in a 'VCC' level; for example, 1.8V) to a high voltage (in a 'VPP' level; for example, 4V). That is, when the level shifter 432 receives the activated pump active signal 'pump_ACT' at the 'VCC' level (not shown), the level shifter 432 provides the received pump active signal 'pump_ACT' as the activated pump active signal 'pump_ACT' at the 'VPP' level. Here, the pump active signal 'pump_ACT' is illustrated to be activated by an active command.

The discharge unit 450 discharges the level of the output node of the pump 420 to the first target level, that is, the write voltage 'VPPWD' level is in the standby state when the pump active signal 'pump_ACT' is deactivated.

The discharge unit 450 will be described in more detail. When the pump active signal 'pump_ACT' is deactivated, the current of the output node of the pump 420 is discharged until the next write operation for a predetermined time so that the write voltage 'VPPWD' in the first target level is maintained. Therefore, the discharge unit 450 reduces current consumption in the standby state and can control the first target level to be rapidly boosted to the second target level in the write operation. Although not shown, the discharge unit 450 may not include a voltage reduce circuit in response to the deactivated pump active signal 'pump_ACT', which is not limited thereto.

As described above, according to one embodiment, since the number of pump units 426 is controlled by sensing the actual current of the cell, it is possible to simplify the circuit and to improve the area efficiency.

In the conventional art, the number of driven pump units 426 is fixed in accordance with the data input and output mode. For example, the control signal is generated so that two pump units 426 are driven when the data input and output mode is X4 and that four pump units 426 are driven when the data input and output mode is X8. However, in this case, although the data input and output mode is X8, the consumption current of the actual cell can be smaller than the simulation value at a designing point of time. The number of pump units 426 can be previously fixed and can be excessively larger than the actually required pump voltage. Therefore, since the controller of the pump units assigned more than required increases and activation and deactivation are to be unnecessarily repeated. Accordingly, as a result the current consumption increases. Furthermore, since a data input and output mode select circuit (not shown) is not necessary, a large footprint is needed. In addition, since data input and output related additional signals are necessary, accordingly as a result, cell current consumption is large due to the RC delay caused by limitations on arranging wiring lines for the signals and the length of the wiring lines.

However, according to one embodiment, since the current of the cell is sensed to control the number of pump units 426, the problems caused by the additional data input and output mode circuit or the wiring lines can be solved. Furthermore, since independent voltage detectors for controlling the standby state and the active state, respectively, are not necessary and the control voltage level 'DIV' required in accordance with the standby state and the active state can be generated by one control voltage generator 430, accordingly as a result, it is possible to improve the area efficiency. In addition, since the common control voltage generator 430 is used, it is possible to prevent element characteristics from being unstable in accordance with a change in processes in comparison with the case where independent voltage detectors are used.

Figure 3:
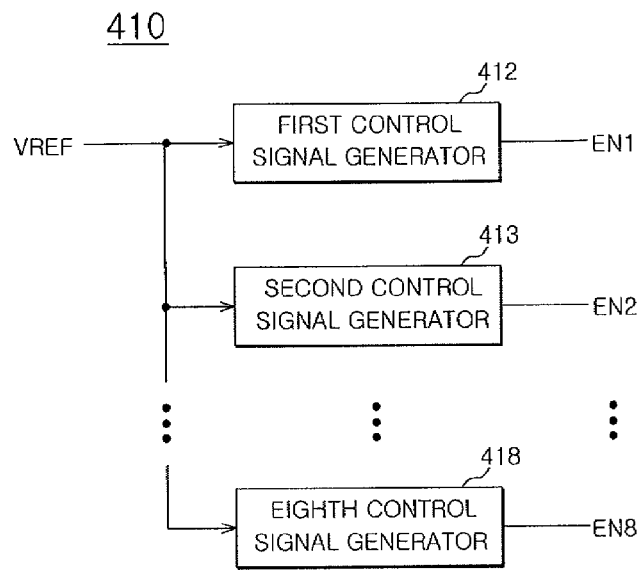
FIG. 3 is a block diagram showing a structure of an example of a control signal generator illustrated in FIG. 2.
Figure 4:
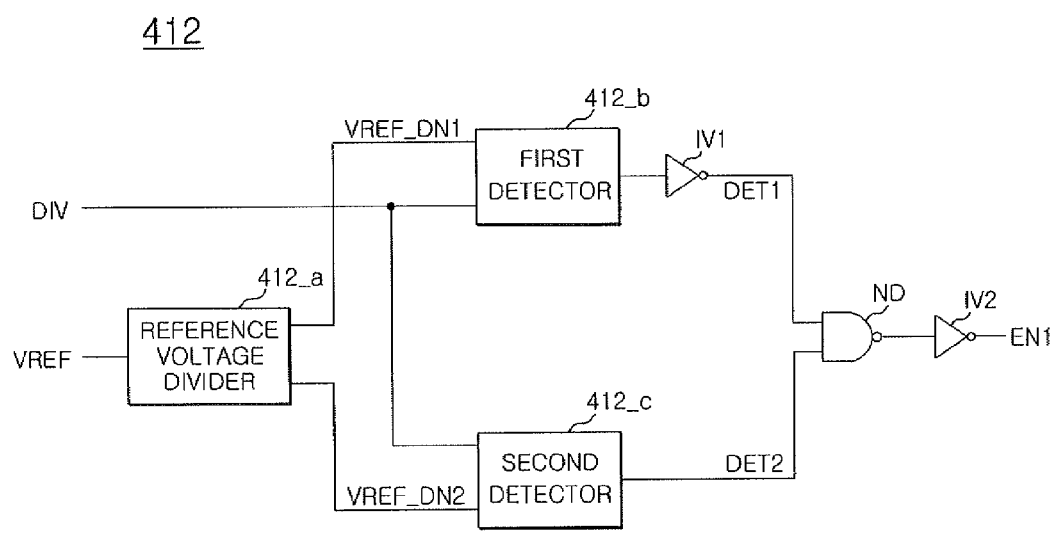
FIG. 4 is a block diagram showing a structure of an example of a first control signal generator illustrated in FIG. 3.

FIG. 3 is a schematic block diagram showing the control signal generator 410 illustrated in FIG. 2. FIG. 4 is a block diagram showing the first control signal generator 412 illustrated in FIG. 3.

Referring to FIGS. 3 and 4, the control signal generator 410 receives one reference voltage 'VREF' to generate the plurality of the control signals 'EN1', 'EN2', 'EN3', The control signal generator 410 includes a plurality of control signal generators 412, 413, . . . 418. The first control signal generator 412 receives the reference voltage 'VREF' to generate the first control signal 'EN1'.

The second control signal generator 413 receives the reference voltage 'VREF' to generate the second control signal 'EN2'. Since the principles of the control signal generators are the same, description thereof will be omitted.

That is, the control signal generator 410 divides one reference voltage 'VREF' in different voltage division ratios to generate the plurality of the control signals 'EN1', 'EN2', 'EN3', . . . 'EN8'.

The first control signal generator 412 will be described in more detail.

The first control signal generator 412 includes a reference voltage divider 412_a, a first detector 412_b, and a second detector 412_c.

The reference voltage divider 412_a receives the reference voltage 'VREF' to provide a first reference signal 'VREF_DN1' and a second reference signal 'VREF_DN2'. That is, the reference voltage divider 412_a divides the reference voltage 'VREF' to provide the first reference signal 'VREF_DN1' and the second reference signal 'VREF_DN2'. Here, the first reference signal 'VREF_DN1' is larger than the second reference signal 'VREF_DN2'.

The first detector 412_b receives the control voltage level 'DIV' and the first reference signal 'VREF_DN1'. The output signal of the first detector 412_b is provided as a first detect signal 'DET1' via a first inverter IV1.

The second detector 412_c provides a second detect signal 'DET2' in response to the control voltage level 'DIV' and the second reference signal 'VREF_DN2'.

The both receive terminals of a NAND gate ND receive the first detect signal 'DET1' and the second detect signal 'DET2' to perform a NAND operation on the first detect signal 'DET1' and the second detect signal 'DET2'. A second inverter IV2 inverts the output signal of the NAND gate ND to provide the inverted output signal as the first control signal 'EN1'.

Next the operation of the first control signal generator 412 will be described.

First, the first control signal generator 412 receive the reference voltage 'VREF' to provide the first reference signal 'VREF_DN1' and the second reference signal 'VREF_DN2' so that a predetermined voltage section of the control voltage level 'DIV' can be detected. For example, the first reference signal 'VREF_DN1' can be 0.9V and the second reference signal 'VREF_DN2' can be 0.8V.

The first detector 412_b determines whether the control voltage level 'DIV' is higher or lower than the level of the first reference signal 'VREF_DN1'. Therefore, when it is determined that the control voltage level 'DIV' is lower than the level of the first reference signal 'VREF_DN1', the first detector 412_b provides a signal in a low level. Therefore, the first detect signal 'DET1' in a high level is provided via the first inverter IV1.

In addition, the second detector 412_c determines whether the control voltage level 'DIV' is higher or lower than the level of the second reference signal 'VREF_DN2'. The second detector 412_c provides the second detect signal 'DET2' in a low level when the control voltage level 'DIV' is lower than the level of the second reference signal 'VREF_DN2'.

Therefore, the first control signal 'EN1' activated only in a section where the first and second detect signals 'DET1' and 'DET2' are all in a high level is provided by the NAND gate ND and the second inverter IV2.

That is, the first control signal generator 412 detects whether the control voltage level 'DIV' is between the first reference signal 'VREF_DN1' and the second reference signal 'VREF_DN2'. Therefore, when the control voltage level 'DIV' is detected in a section of the voltage level of the first reference signal 'VREF_DN1' and the second reference signal 'VREF_DN2', the activated first control signal 'EN1' is provided.

Hereinafter, the control signal generators 413 . . . 418 that are not described receive the same control voltage level 'DIV' to detect whether the control voltage level 'DIV' is in a section of the respective reference signal in the above-mentioned similar manner and to determine whether the control signals 'EN2' . . . 'EN8' corresponding to the control signal generators 413 . . . are activated.

The control voltage level 'DIV' is a voltage signal obtained by transferring the current write voltage 'VPPWD' in reflection with whether the cell is activated. Therefore, the control voltage level 'DIV' varies in accordance with whether the cell is in the standby state or the active state. The control voltage level 'DIV' according to one embodiment is provided by dividing the write voltage 'VPPWD' in different voltage division ratios in accordance with the current state of the cell.

Figure 5:
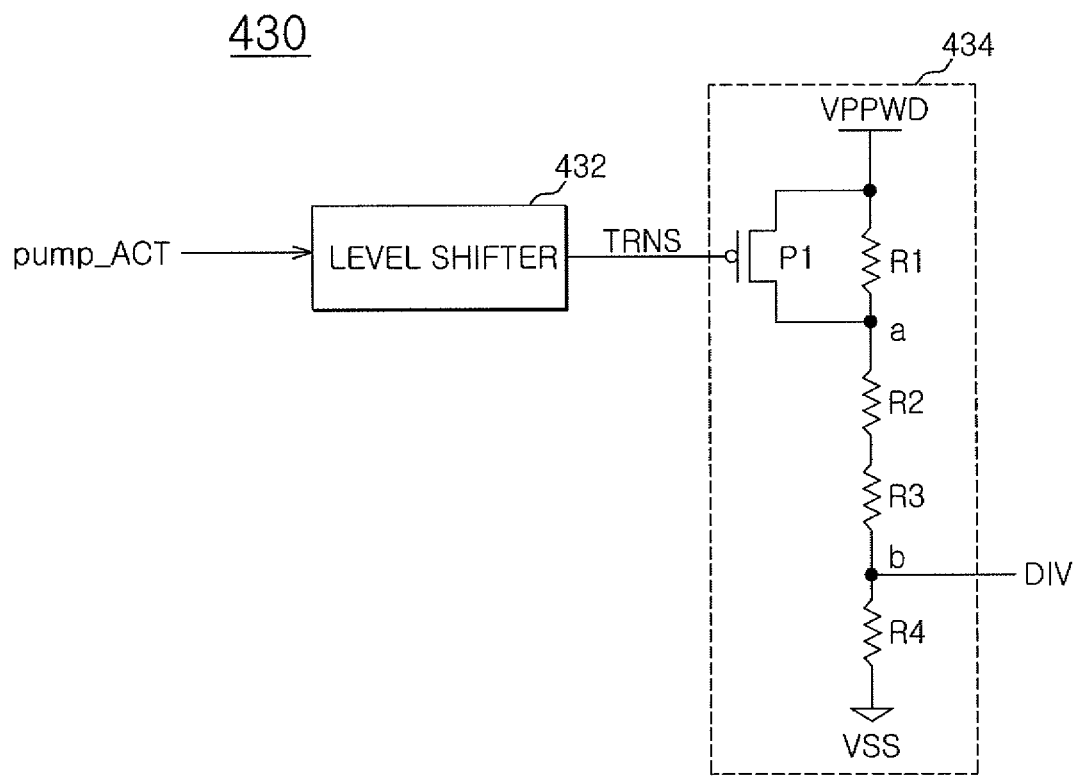
FIG. 5 is a circuit diagram showing a structure of an example of a control voltage generator illustrated in FIG. 2.

FIG. 5 is a circuit diagram showing the control voltage generator 430 illustrated in FIG. 2.

Referring to FIG. 5, the control voltage generator 430 receives the pump active signal 'pump_ACT' and the output signal of the pump unit (refer to 420 of FIG. 2), that is, the write voltage 'VPPWD' to generate the control voltage level 'DIV' at different levels in accordance with whether the pump active signal 'pump_ACT' is activated.

The level shifter 432 level shifts the pump active signal 'pump_ACT'. The pump active signal 'pump_ACT' is a signal in a normal power level. The activated high level can be 1.8V.

As described above, when the deactivated pump active signal 'pump_ACT' in a low level is received, the level shifter 432 provides a transfer signal 'TRNS' in a low level of a ground power level. However, when the activated pump active signal 'pump_ACT' in a high level is received, the level shifter 432 provides the level changed transfer signal 'TRNS', for example, of 4V.

The voltage divider 434 divides a predetermined voltage in response to the output signal of the level shifter 432 to generate the control voltage level 'DIV'.

The voltage divider 434 includes a first PMOS transistor P1 and a plurality of resistors R1 to R4 serially connected to each other.

The first PMOS transistor P1 includes a gate for receiving the transfer signal 'TRNS', a source for receiving the write voltage 'VPPWD', and a drain connected to a node a.

The first resistor R1 is provided between the node 'a' and a write voltage 'VPPWD' terminal.

The second to fourth resistors R2 to R4 are sequentially and serially connected to each other. An output node b is provided between the third and fourth resistors R3 and R4.

Next, the operation of the control voltage generator 430 will be described in more detail.

First, the case in which the deactivated pump active signal 'pump_ACT' is provided will be described. The deactivated pump active signal 'pump_ACT' in a mode of deactivating the pump unit (refer to 420 of FIG. 2) is in the standby state as described above.

In this case, the voltage divider 434 receives the transfer signal 'TRNS' in a low level. Therefore, since the first PMOS transistor P1 that receives the transfer signal 'TRNS' in the low level is turned on, the first resistor R1 has a value regardless of the voltage of the output node b. Therefore, the control voltage level 'DIV' can be generated as illustrated in EQUATION 1.

$$DIV = (R4/R2+R3+R4) * VPPWD \quad \text{[EQUATION 1]}$$

When the activated pump active signal 'pump_ACT' is provided, the activated pump active signal 'pump_ACT' remains activated by the level shifter 432. However, only the voltage level is provided as the shifted transfer signal 'TRNS'.

Therefore, the first PMOS transistor P1 that receives the transfer signal 'TRNS' in a high voltage level is turned off. Therefore, the voltage of the output node b has a voltage division level to which all of the resistors R1 to R4 are related. Therefore, when the activated pump active signal 'pump_ACT' is provided, the control voltage level 'DIV' can be calculated by EQUATION 2.

$$DIV = (R4/R1+R2+R3+R4) * VPPWD \quad \text{[EQUATION 2]}$$

That is, when all of the resistors R1 to R4 have the same resistance value, the control voltage generator 430 becomes a ¼ voltage divider in the case where the pump active signal 'pump_ACT' is activated and becomes a ⅓ voltage divider in the case where the pump active signal 'pump_ACT' is deactivated.

That is, the control voltage generator 430 drives the write voltage 'VPPWD' of, for example, 3V in the first target level in the standby state by the ⅓ voltage divider to generate the control voltage level 'DIV'. Therefore, when the write voltage 'VPPWD' satisfies the first target level, the control voltage level 'DIV' can have actually the same level as, for example, 1V that is the reference voltage 'VREF' of the pump unit (refer to 420 of FIG. 2).

In a similar principle, the control voltage generator 430 divides the write voltage 'VPPWD' of, for example, 4V in the second target level in the active state by the ¼ voltage divider. Therefore, when the control voltage level 'DIV' generated when the write voltage 'VPPWD' satisfies 4V that is the second target level can have actually the same level as 1V that is the reference voltage 'VREF' of the pump unit (refer to 420 of FIG. 2).

Therefore, the non-volatile semiconductor memory circuit compares the control voltage level 'DIV' in the standby state with the plurality of the reference signals 'VREF_DN1, VREF_DN2, . . .' divided from the reference voltage 'VREF' to properly control the voltage pumping amount of the pump unit (refer to 420 of FIG. 2) to reach the first target level. The non-volatile semiconductor memory circuit compares the control voltage level 'DIV' in the write mode with the plurality of the reference signals 'VREF_DN1, VREF_DN2, . . .' divided from the reference voltage 'VREF' to properly control the voltage pumping amount of the pump unit (refer to 420 of FIG. 2) to reach the second target level.

Figure 6:
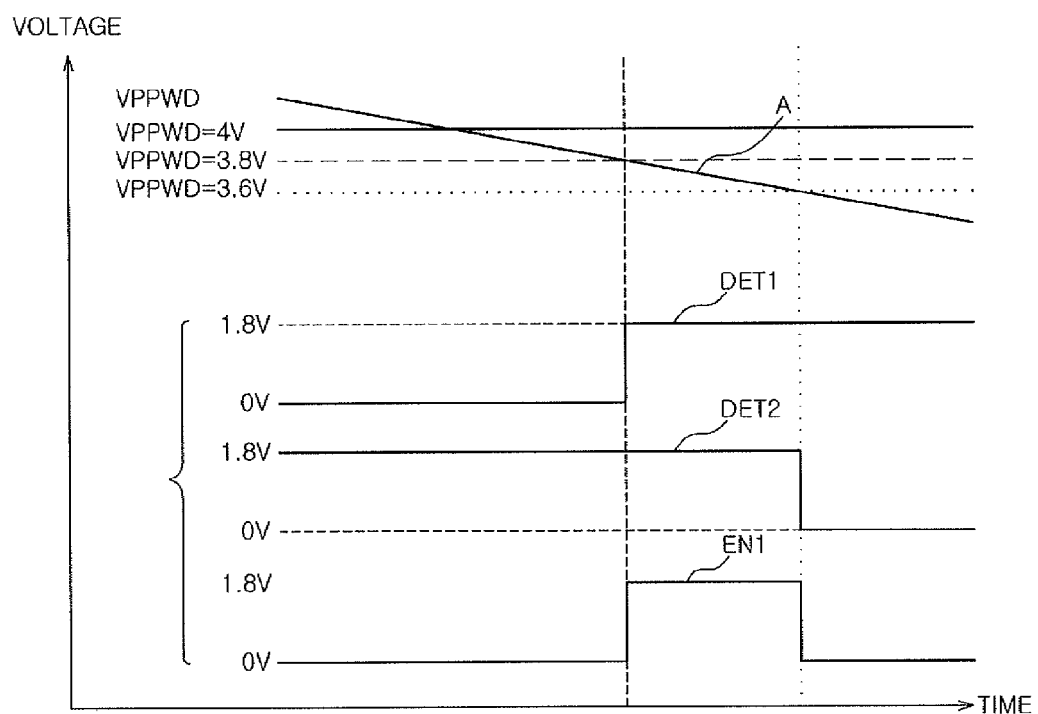
FIG. 6 is a voltage waveform showing relationships between a write voltage and a first control signal in accordance with FIGS. 1 to 5.

FIG. 6 is a voltage waveform diagram illustrating relationships between the operation of the non-volatile semiconductor memory and the write voltage 'VPPWD' in accordance with FIGS. 1 to 5.

Referring to FIG. 6, the case in which the write voltage 'VPPWD' in the write mode is used as a target is illustrated.

With reference to FIGS. 1 to 6, controlling the pump operation of the non-volatile semiconductor memory will be described.

First, the target level of the write voltage 'VPPWD' in the write mode will be illustrated as 4V as described above.

It is illustrated that the write voltage 'VPPWD' is increased and reduced by the pulse step in a predetermined voltage section (for example, 0.2V). However, the write voltage 'VPPWD' can vary in accordance with the structure of the circuit, the application level of the circuit, or the resolution of voltage control.

Here, the first control signal generator 412 is illustrated as a circuit for detecting a section A in which the write voltage 'VPPWD' is 3.6V to 3.8V.

In this case, the pump active signal 'pump_ACT' is activated so that the voltage divider 434 drives the write voltage 'VPPWD' by the ¼ divider. Therefore, the control voltage level 'DIV' of 0.95V will be generated for the write voltage 'VPPWD' of 3.8V.

The first control signal generator 412 determines whether the control voltage level 'DIV' is no less than 0.8V and no more than 0.9V by the first and second detectors 412_b and 412_c. In this case, since the control voltage level 'DIV' is larger than 0.9V, the first control signal 'EN1' is deactivated.

However, then, at the moment when the write voltage 'VPPWD' is more reduced to 3.6V, the voltage divider 434 of the control voltage generator 430 divides the write voltage 'VPPWD' to generate the control voltage level 'DIV' of 0.9V. In this case, since the control voltage level 'DIV' is sensed in the detect section of the first control signal generator 412, the first control signal 'EN1' is activated.

That is, the first detector 412_b compares the first reference signal 'VREF_DN1' with the control voltage level 'DIV' to provide the first detect signal 'DET1' in a high level. When the above is described based on the write voltage 'VPPWD', it is noted that the first detect signal 'DET1' is in a high level in the section where the write voltage 'VPPWD' is no more than 3.6V.

Since the second detector 412_c compares the second reference signal 'VREF_DN2' with the control voltage level 'DIV' to provide the activated second detect signal 'DET2' in a low level when the control voltage level 'DIV' is no more than 0.8V, the second detect signal 'DET2' is in a high level in the section A.

Therefore, the first control signal 'EN1' is activated only in the section where the first and second detect signals 'DET1' and 'DET2' are all in a high level, that is, where the control voltage level 'DIV' is 0.8v to 0.9V. In other words, the section in which the write voltage 'VPPWD' is 3.6V to 3.8V is detected to activate the first control signal 'EN1'. Therefore, the pump driver 422 and the pump units 426 that receive the first control signal 'EN1' are driven to pump the voltage.

Although not shown, when the write voltage 'VPPWD' is continuously reduced, the voltage generator 400 increases the number of driven pump units 426 so that the write voltage 'VPPWD' reaches the second target level.

For convenience sake, only the voltage section A was described. However, the section of 3.8V to 4V can be set in accordance with the reference signal to drive the pump units 426. According to one embodiment, the detect section of the write voltage 'VPPWD' can be set to control the number of pump units 426 driven in the pump 420 using the reference signals.

On the other hand, only the case in which whether the write voltage 'VPPWD' is pumped is controlled to reach the second target level in the write mode is illustrated. However, the case in which whether the write voltage 'VPPWD' is pumped is controlled to reach the first target level in the standby mode can be described in a similar principle.

As described above, according to one embodiment, the common control voltage generator 430 is controlled by whether the pump active signal 'pump_ACT' is activated. Therefore, the target voltage level in the write mode can be set to be different from the target voltage level in the standby mode. That is, since the pump units 426 are driven by detecting the current of the actual cell, the write voltage 'VPPWD' can be flexibly provided. Therefore, the application of the circuit is flexible.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A non-volatile semiconductor memory circuit, comprising:
   a memory cell array; and
   a voltage generator configured to determine whether the memory cell array is an active state in accordance with an amount of current detected by the memory cell array, and provide a write voltage at a target level such that the target level of the write voltage varies in response to an amount of current detected by the memory cell array using a reference voltage.

2. The non-volatile semiconductor memory circuit of claim 1, wherein the voltage generator comprises:

a control voltage generator configured to provide a control voltage level such that the control voltage level varies in accordance to a logic state of a pump active signal activated in an active mode;

a control signal generator configured to detect whether the control voltage level is in a predetermined voltage section by using the reference voltage to generate a plurality of control signals; and a pump configured to control an amount of a pump voltage in response to the control signals to provide the target level of the write voltage.

3. The non-volatile semiconductor memory circuit of claim 2, wherein the control voltage generator is configured to generate the control voltage level for the write voltage at a first target level of the write voltage in response to the deactivated pump active signal and configured to generate the control voltage level for the write voltage at a second target level of the write voltage in response to the activated pump active signal.

4. The non-volatile semiconductor memory circuit of claim 2, wherein the control signal generator is configured to divide the reference voltage in different voltage division ratios to generate a plurality of reference signals.

5. The non-volatile semiconductor memory circuit of claim 4, wherein when the control voltage level is detected between the adjacent reference signals from among the reference signals then the control signal generator is configured to activate control signals corresponding to the adjacent reference signals.

6. The non-volatile semiconductor memory circuit of claim 2, wherein the pump comprises a plurality of pump units configured to receive the control signals.

7. The non-volatile semiconductor memory circuit of claim 6, wherein the pump unit is driven in response to the activated control signal.

8. The non-volatile semiconductor memory circuit of claim 1, wherein the memory cell array comprises phase change random access memory (PCRAM) cells.

9. A non-volatile semiconductor memory circuit, comprising:

a memory cell array;

a write controller configured to repeatedly verify and determine whether input data is written down in the memory cell array to write the input data in response to a write command; and a voltage generator configured to control a voltage division ratio to vary in accordance with whether the memory cell array is in an active state to provide a write voltage having different target levels in accordance to a reference voltage.

10. The non-volatile semiconductor memory circuit of claim 9, wherein the voltage generator comprises:

a control voltage generator configured to provide a control voltage level such that the control voltage level varies in accordance with a logic state of a pump active signal activated in an active mode;

a control signal generator configured to detect whether the control voltage level is within a predetermined voltage section using the reference voltage to generate a plurality of control signals; and a pump configured to control an amount of a pump voltage in response to the control signals to provide the write voltage at a corresponding target level.

11. The non-volatile semiconductor memory circuit of claim 10, wherein the control voltage generator is configured to generate the control voltage level for the write voltage in a first target level in response to the deactivated pump active signal and configured to generate the control voltage level for the write voltage in a second target level in response to the activated pump active signal.

12. The non-volatile semiconductor memory circuit of claim 10, wherein the control signal generator is configured to divide the reference voltage into different voltage division ratios to generate a plurality of reference signals.

13. The non-volatile semiconductor memory circuit of claim 12, wherein when the control voltage level is detected between adjacent reference signals then the control signal generator is configured to activate control signals corresponding to the adjacent reference signals.

14. The non-volatile semiconductor memory circuit of claim 10, wherein the pump comprises a plurality of pump units configured to receive the control signals.

15. The non-volatile semiconductor memory circuit of claim 14, wherein the pump unit is driven in response to the activated control signal.

16. The non-volatile semiconductor memory circuit of claim 9, wherein the memory cell array comprises phase change random access memory (PCRAM) cells.

17. A non-volatile semiconductor memory circuit, comprising:

a memory cell array; and a voltage generator configured to distinguish a standby state of the memory cell array from an active state of the memory cell array and then configured to provide a write voltage having a target level corresponding to either the standby or the active state, by varying the target level of the write voltage in accordance with an amount of current detected by the memory cell array, wherein the voltage generator generates the write voltage at a first target level corresponding to the standby state and generates the write voltage at a second target level corresponding to the active state in which the second target level of the write voltage is larger than the first target level of the write voltage.

18. The non-volatile semiconductor memory circuit of claim 17, wherein the voltage generator comprises:

a control voltage generator configured to control a voltage division ratio to vary in accordance with a logic state of a pump active signal activated when the memory cell array is in the active state such that the control voltage generator provides a control voltage level; and a control signal generator configured to detect whether the control voltage level is within a predetermined voltage section by using a reference voltage to generate a plurality of control signals; and a pump including a plurality of pump units configured to selectively control the number of pump units in response to the control signals.

19. The non-volatile semiconductor memory circuit of claim 18, wherein the control voltage generator is configured to divide the write voltage into a first voltage division ratio in response to the deactivated pump active signal to generate the control voltage level and configured to divide the write voltage into a second voltage division ratio in response to the activated pump active signal to generate the control voltage level.

20. The non-volatile semiconductor memory circuit of claim 19, wherein the control voltage generator comprises a voltage divider configured to divide the write voltage in the first and second voltage division ratios in response to the pump active signal to provide the control voltage level.

21. The non-volatile semiconductor memory circuit of claim 20, wherein the control voltage generator further comprises a level shifter for receiving the pump active signal to perform level shifting, and wherein the voltage divider is configured to respond to an output signal of the level shifter.

22. The non-volatile semiconductor memory circuit of claim 18, wherein the control signal generator is configured to divide the reference voltage in different voltage division ratios to generate a plurality of reference signals.

23. The non-volatile semiconductor memory circuit of claim 22, wherein when the control voltage level is detected between adjacent reference signals then the control signal generator is configured to activate control signals corresponding to the adjacent reference signals.

24. The non-volatile semiconductor memory circuit of claim 18, wherein the pump units of the pump are driven in response to the activated control signal.

25. The non-volatile semiconductor memory circuit of claim 17, wherein the memory cell array comprises phase change random access memory PCRAM cells.

* * * * *